(12) United States Patent
Kaertner et al.

(10) Patent No.: US 8,976,447 B2
(45) Date of Patent: Mar. 10, 2015

(54) BROADBAND DISPERSION-FREE OPTICAL FILTER CAVITIES BASED ON DIELECTRIC MIRRORS WITH COMPLEMENTARY DISPERSION

(75) Inventors: Franz X. Kaertner, Newtown, MA (US); Li-Jin Chen, Somerville, MA (US); Guoqing Chang, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 968 days.

(21) Appl. No.: 13/100,068

(22) Filed: May 3, 2011

(65) Prior Publication Data

US 2011/0274135 A1    Nov. 10, 2011

Related U.S. Application Data

(60) Provisional application No. 61/331,266, filed on May 4, 2010.

(51) Int. Cl.
  *H01S 3/00* (2006.01)
  *G02B 5/08* (2006.01)
  *G02B 17/00* (2006.01)
  *H01S 5/00* (2006.01)

(52) U.S. Cl.
  CPC ............ *G02B 5/0825* (2013.01); *G02B 17/004* (2013.01); *H01S 5/0078* (2013.01)
  USPC ...................................................... 359/337.5

(58) Field of Classification Search
  USPC ........... 359/237, 260, 333, 337, 337.1, 337.5, 359/346, 347, 350, 359, 577, 580, 582, 584, 359/586, 588, 589, 590
  See application file for complete search history.

(56) References Cited

U.S. PATENT DOCUMENTS

| 2004/0042083 | A1* | 3/2004 | Turner, III | 359/578 |
| 2006/0280512 | A1* | 12/2006 | Sato | 398/212 |
| 2009/0285245 | A1 | 11/2009 | Liu et al. | |
| 2010/0226003 | A1* | 9/2010 | Lefebvre et al. | 359/330 |

FOREIGN PATENT DOCUMENTS

| JP | 4142179 B2 | 8/2008 |
| WO | WO 2008000773 A1 * | 1/2008 |

OTHER PUBLICATIONS

Kartner et al., Ultrabroadband double-chirped mirror pairs for generation of octave spectra, J. Opt. Soc. Am. B/vol. 18, No. 6/Jun. 2001, pp. 882-885.*

(Continued)

*Primary Examiner* — Jennifer L Doak
*Assistant Examiner* — Kimberly N Kakalec
(74) *Attorney, Agent, or Firm* — Modern Times Legal; Robert J. Sayre (57) ABSTRACT

A substantially dispersion-free optical filter cavity includes a first multilayer mirror and a second multilayer mirror, wherein each mirror includes layers of a less-refractive material and layers of a more-refractive material, the more-refractive material having a higher index of refraction than the less-refractive material. The mirrors are separated by a spacing, and the thickness of a plurality of the layers in the second multilayer mirror differ from corresponding layers in the first multilayer mirror to provide the cavity with complementary group-delay dispersion across the cavity with a phase difference within, e.g., ±0.015 rad across a range of wavelengths spanning at least, e.g., 50 nm.

14 Claims, 5 Drawing Sheets

(56) References Cited

OTHER PUBLICATIONS

Korean Intellectual Property Office, International Search Report and Written Opinion for PCT/US2011/035074 (PCT application corresponding to subject US application) (Feb. 8, 2012).
European Patent Office, English-language abstract for JP 4142179 B2 (cited above).
Chen, Li-Jin, et al., "Broadband dispersion-free optical cavities based on zero group delay dispersion mirror sets", Optics Express, vol. 18, Issue 22 (Oct. 19, 2010), pp. 23204-23211.
Chen, Li-Jin, et al., "Complementary Chirped-Mirror Pair for Broadband Dispersion-Free Cavities", OSA Technical Digest, Optical Society of America (Jun. 2010), pp. 1-3.
Chen, Li-Jin, et al., "High-Finesse Dispersion-Free Cavities for Broadband Filtration of Laser Comb Lines", OSA Technical Digest (CD), Optical Society of America (Jul. 2010), pp. 1-3.
Li, Chih-Hao, et al., "A laser frequency comb that enables radial velocity measurements with a precision of 1 cm s-1", Nature, vol. 452 (Apr. 3, 2008), pp. 610-612.
Thorpe, Michael J., "Broadband Cavity Ringdown Spectroscopy for Sensitive and Rapid Molecular Detection", Science, vol. 311, No. 5767 (Mar. 17, 2006), pp. 1595-1599.
Murphy, M. T., et al., "High-precision wavelength calibration of astronomical spectrographs with laser frequency combs", arXiv:astro-ph/0703622v2 (Feb. 5, 2008), pp. 1-10.
Udem, TH., et al., "Optical frequency metrology", Nature vol. 416 (Mar. 14, 2002), pp. 233-237.

\* cited by examiner

BROADBAND DISPERSION-FREE OPTICAL FILTER CAVITIES BASED ON DIELECTRIC MIRRORS WITH COMPLEMENTARY DISPERSION

RELATED APPLICATION

This application claims the benefit of U.S. Provisional Application No. 61/331,266, filed 4 May 2010, the entire content of which is incorporated herein by reference.

GOVERNMENT SUPPORT

This invention was made with government support under Contract. No. HR0011-05-C-0155 awarded by the Defense Advanced Research Projects Agency and under Grant No. AST0905592 awarded by the National Science Foundation. The government has certain rights in this invention.

BACKGROUND

Optical frequency combs with equally-spaced laser lines that are strictly determined by the laser repetition-rate and the carrier-envelope-offset frequency have become powerful tools for exploring many physical phenomena to unprecedented levels. By stabilizing both frequencies (repetition-rate and carrier-envelope-offset frequencies), one can not only identify the absolute frequency of each line and achieve extremely high precision and stability in frequency metrology applications [T. Udem, et al., "Optical frequency metrology," Nature 416, 233-237 (2002)], but also use these frequencies for additional applications such as resonant enhancement of optical pulses [M. J. Thorpe, et al., "Broadband cavity ringdown spectroscopy for sensitive and rapid molecular detection," Science 311, 1595 (2006)] and calibration of astronomical spectrographs (astro-comb). [M. T. Murphy, et al., "High-precision wavelength calibration with laser frequency combs," Mon. Not. R. Astron. Soc. 380, 839-847 (2007); and C.-H. Li, et al., "A laser frequency comb that enables radial velocity measurements with a precision of 1 cm/s," Nature 452, 610 (2008)]. In both of the later applications, optical filter cavities are incorporated, and their performance significantly affects the practicability of these applications. Brief descriptions of applications that use filter cavities are provided, below.

First, for an enhancement cavity, the equally-spaced spectral lines from a frequency comb are coupled into a high-finesse optical cavity with its free-spectral range (FSR) matched to the laser repetition rate. In this way, all the frequency components are in phase, which constructively enhance the resonant pulse circulating inside the cavity.

Second, in high-precision wavelength calibration with laser frequency combs (or astro-comb) application, the optical cavities are used to increase the comb spacing, which enables the calibration of lower resolution spectrographs using lasers with lower fundamental repetition rates. In this case, the cavity's free-spectral range is a multiple of the source-comb spacing, and the cavity acts as a filter that selectively blocks unwanted lines and passes those aligned with the cavity's transmission peaks. Such a filtered comb with increased line spacing has become an advantageous calibration tool for astronomical spectrographs, which holds promise for finding exoplanets similar to the Earth.

Optical filter cavities are typically formed by two or more mirrors of high reflectivity. In the ideal case, when these mirrors are carefully aligned, the Fabry-Perot (FP) cavity will have periodic transmission peaks in the frequency domain with their spacing determined by the physical distance of the round-trip path. Therefore, by carefully adjusting this distance, one should theoretically be able to match these transmission peaks to all of the femtosecond laser frequency comb lines since they are also equally spaced. However, in practice, the cavity's resonances undergo a wavelength-dependent shift due to the phase error accumulated from the dispersion of cavity mirrors and the intracavity material. As a result, the mismatch between cavity's transmission peaks and the input laser comb lines leads to dropout of comb-teeth, which may greatly reduce the overall spectral width coupled into the cavity and therefore imposes practical limitations to the aforementioned applications. In experiments utilizing the resonant field enhancement, the cavity bandwidth determines the transform-limited pulse duration as well as the peak intensity of the circulating pulses. In high-precision wavelength calibration, this mismatch limits the spectral coverage of the comb lines which limits the sensitivity to small frequency drifts. Therefore, development of broadband, dispersion-free cavity mirrors is highly advantageous. The design described herein can successfully extend the bandwidth of optical cavities over traditional designs.

Figure 1:
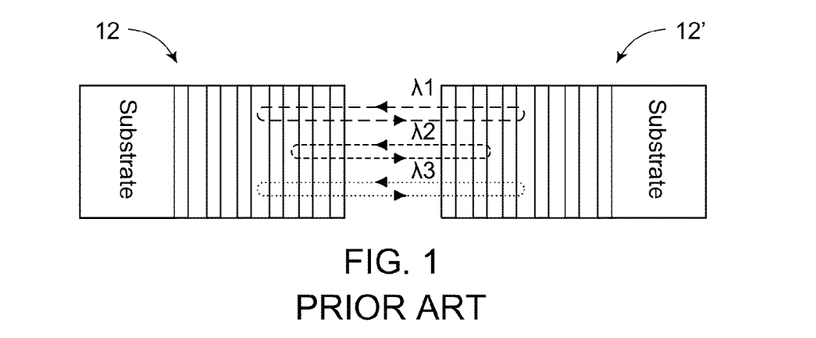
FIG. 1 is a schematic illustration of a two-mirror dispersion-free cavity based on a Bragg-stack mirror pair.
Figure 2:
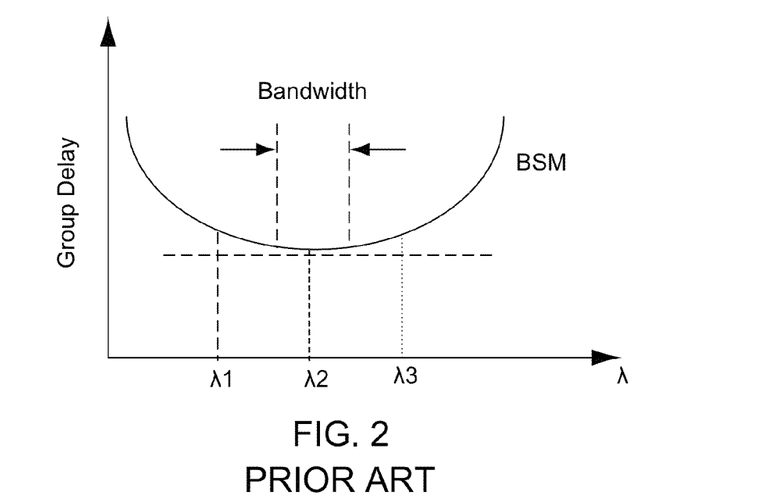
FIG. 2 plots curves showing the individual and average group delay on the cavity mirrors as a function of wavelength for the cavity of FIG. 1.

The traditional design of such cavities is based on Bragg-stack mirrors (BSMs), as shown in FIG. 1; and a plot of the mirror penetration depth as a function of wavelength for this design is provided in FIG. 2. Although BSMs are typically high reflectors with moderate bandwidth, not all wavelengths are reflected from the same depth of the structure. Consequently, only a small portion of the spectrum near the center of the high-reflectivity region has negligible dispersion, leading to a very limited bandwidth of the resulting Fabry-Perot cavity. This bandwidth degradation becomes even worse when the dispersion from intracavity materials is taken into account. As a result, the cavity is placed in vacuum if the cavity length is too long such that the air dispersion is eliminated.

SUMMARY

A broadband dispersion-free optical filter cavity and methods of operation are described herein. Various embodiments of the apparatus and methods may include some or all of the elements, features and steps described below.

A substantially dispersion-free optical filter cavity, as described herein, includes a first multilayer mirror and a second multilayer mirror, wherein each mirror includes layers of a less-refractive material and layers of a more-refractive material, the more-refractive material having a higher index of refraction than the less-refractive material, and the layers being successively arranged from an inner layer to an outer layer. The mirrors are separated by a spacing, and the thickness of a plurality of the layers in the second chirped mirror differ from corresponding layers in the first chirped mirror to provide the cavity with complementary group-delay dispersion across the cavity with a phase difference within, e.g., ±0.015 rad across a range of wavelengths spanning at least, e.g., 50 nm.

Figure 8:
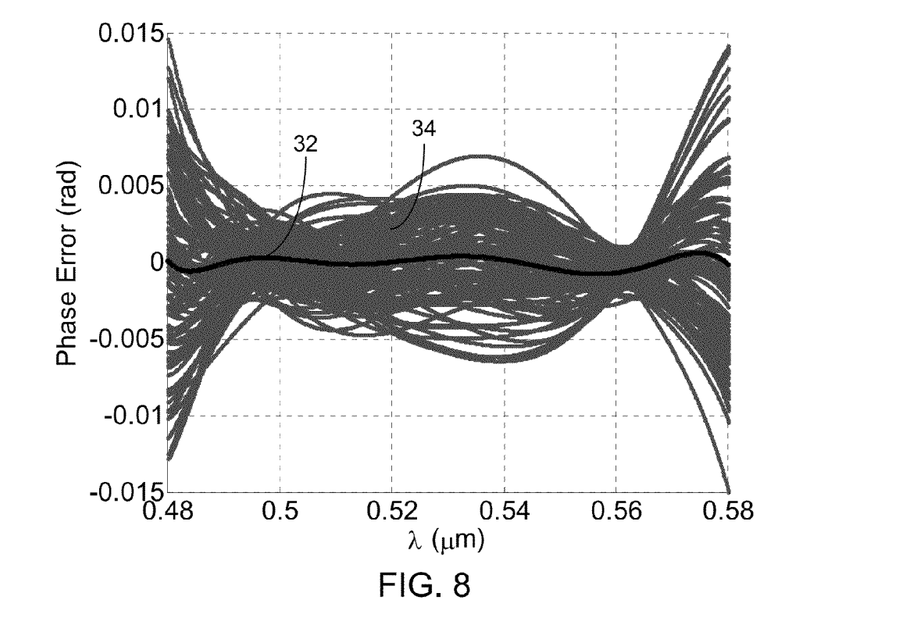
FIG. 8 plots the simulated phase deviation from a dispersion-free cavity using one zero-GDD mirror pair; the deviation of the ideal zero-GDD mirror pair design is near horizontal band in the center deviating only slightly from zero phase error, and the spread of possible phase errors with 100 tests assuming a random manufacturing error of ±0.5 nm for the mirror layer thicknesses is shown with the broader band of plots.

A broadband dispersion-free optical cavity using a zero-group-delay-dispersion (zero-GDD) mirror set is demonstrated herein. As used herein, the term, zero-group-delay dispersion means zero or negligible group-delay dispersion (e.g., with the phase error not exceeding ±0.015 rad, as shown in FIG. 8). The zero-GDD mirror sets include two or more dielectric mirrors with opposite group delay dispersion, that when used together, can form an optical cavity with vanishing dispersion over an enhanced bandwidth in comparison with traditional low-GDD mirrors.

The broadband zero-dispersion optical cavity can be designed to have wavelength-independent free-spectral range, or equivalently wavelength-independent round-trip optical length over a broad bandwidth to ensure that the frequencies of the transmission resonances are aligned with equally spaced frequency comb lines. For short-pulse field enhancement, the cavity bandwidth limits the transform-limited pulse duration as well as the peak intensity of the circulating pulses. In astrophysical spectrograph calibration, the cavity bandwidth limits the available wavelength coverage and thus compromises the calibration accuracy. Currently, most of the enhancement or filter cavities are constructed from dielectric mirrors that are individually designed to have negligible dispersion or compensate the GDD of intracavity materials at a certain wavelength range.

Herein, a design for an optical cavity is demonstrated that includes a set of dielectric mirrors with zero GDD in reflection, which allows optimization of many mirrors simultaneously to extend cavity bandwidth. The group-delay dispersion determines the round-trip travel time for the various wavelengths between the mirrors. By balancing the group-delay dispersion of the mirrors, while accounting for the cavity atmosphere, the round-trip time can be equated across a broad range of wavelengths and matched to a resonance frequency for the cavity. As an example, a design and experimental demonstration of what is believed to be the first zero-GDD mirror pair with 100-nm bandwidth (480-580 nm) and ~99.2% reflectivity using $Nb_2O_5/SiO_2$ layer pairs are presented. This mirror pair is designed for construction of a Fabry-Perot (FP) filter cavity with 40 GHz free-spectral range (FSR), a pivotal device for implementing a broadband astro-comb in the visible wavelength range.

Instead of restricting the dispersion of each cavity mirror to zero using quarter-wave layers (i.e., where the layer's thickness multiplied by its index of refraction is one-quarter of the central wavelength of the zero-GDD light), as in the BSM-based design, designs described herein target obtaining a constant cavity round-trip time while allowing non-zero dispersion on each mirror for all (or a broad range—up to, e.g., a span of an octave and a half) of the wavelengths inside the mirror bandwidth. The dispersion of individual cavity mirrors is designed to be complementary to the sum of the dispersion of all other mirrors and air. Typically, the design will include at least one positive-dispersion mirror and one negative-dispersion mirror if the air dispersion is negligible. For example, in the case of short two-mirror cavities, the group-delay dispersion from the two mirrors can be exactly complementary. However, for a long cavity where air can contribute significant positive dispersion, the apparatus may have all negative-dispersion mirrors. But, in either case, the group-delay dispersion of the cavity mirrors can be complementary. Additionally, because air dispersion can be taken into account in the design process, vacuum operation of the cavity can be rendered unnecessary.

BRIEF DESCRIPTION OF THE DRAWINGS

In the accompanying drawings, like reference characters refer to the same or similar parts throughout the different views. The drawings are not necessarily to scale, emphasis instead being placed upon illustrating particular principles, discussed below.

DETAILED DESCRIPTION

The foregoing and other features and advantages of various aspects of the invention(s) will be apparent from the following, more-particular description of various concepts and specific embodiments within the broader bounds of the invention(s). Various aspects of the subject matter introduced above and discussed in greater detail below may be implemented in any of numerous ways, as the subject matter is not limited to any particular manner of implementation. Examples of specific implementations and applications are provided primarily for illustrative purposes.

Unless otherwise defined, used or characterized herein, terms that are used herein (including technical and scientific terms) are to be interpreted as having a meaning that is consistent with their accepted meaning in the context of the relevant art and are not to be interpreted in an idealized or overly formal sense unless expressly so defined herein. For example, if a particular composition is referenced, the composition may be substantially, though not perfectly pure, as practical and imperfect realities may apply; e.g., the potential presence of at least trace impurities (e.g., at less than 1 or 2% by weight or volume) can be understood as being within the scope of the description; likewise, if a particular shape is referenced, the shape is intended to include imperfect variations from ideal shapes, e.g., due to machining tolerances.

Although the terms, first, second, third, etc., may be used herein to describe various elements, these elements are not to be limited by these terms. These terms are simply used to distinguish one element from another. Thus, a first element, discussed below, could be termed a second element without departing from the teachings of the exemplary embodiments.

The terminology used herein is for the purpose of describing particular embodiments and is not intended to be limiting of exemplary embodiments. As used herein, singular forms, such as "a" and "an," are intended to include the plural forms as well, unless the context indicates otherwise. Additionally, the terms, "includes," "including," "comprises" and "comprising," specify the presence of the stated elements or steps but do not preclude the presence or addition of one or more other elements or steps.

As a linear closed-loop system, a passive optical cavity can be modeled in a lumped way with its loop transfer function, $H(\omega)$, determined by all cavity mirrors and intracavity materials per round-trip. The magnitude, $|H(\omega)|$, is the accumulated amplitude decay ratio and the phase shift is $\phi(\omega) = \angle H(\omega)$. Assuming that an input field is coupled into the cavity and propagating to a certain reference plane, the power spectrum of the circulating pulse at that plane is scaled by the following closed-loop transfer function:

$$\left| \frac{1}{1 - |H(\omega)|e^{j\phi(\omega)}} \right|^2. \quad (1)$$

For a passive high-finesse cavity, $|H(\omega)|$ is close to but less than one. Inside the cavity, resonant frequencies, corresponding to the phase shift, $\phi(\omega)$, being a multiple of $2\pi$, are significantly enhanced. From a simple physical viewpoint, this phase shift originates from the required round-trip time for the light at a certain wavelength. When the round-trip time is wavelength-independent, $\phi(\omega)$ becomes simply a linear function of the frequency, $\omega$. Therefore, the resulting resonances are equally spaced in the frequency domain. By careful adjustment of the cavity length and eventually also the carrier-envelope offset frequency of the laser, these resonant frequencies can be tuned to align with frequency comb lines. Due to the cavity dispersion, however, the non-constant mode spacing causes a mismatched cavity. The tolerance against residual dispersion depends on the cavity finesse. As $|H(\omega)|$ approaches a high finesse cavity (i.e., $|H(\omega)| \to 1$), the closed loop transfer function is more sensitive to the phase, and the resulting tolerance to dispersion-induced deviations in mode spacing caused by phase deviations becomes smaller. In other words, even a small phase deviation from a multiple of $2\pi$ can lead to a dramatic decrease in the cavity's transmission for frequencies around resonances. One can derive a simple criterion for estimating this phase tolerance by solving for the phase corresponding to half of the maximum of function (1) and find:

$$\phi(\omega) < \frac{1 - |H(\omega)|}{\sqrt{|H(\omega)|}} \approx 1 - |H(\omega)|, \text{ for } |H(\omega)| \approx 1. \quad (2)$$

For example, to design a dispersion-free Fabry-Perot cavity consisting of two identical mirrors with a reflectivity of 99% ($|H(\omega)| = \sqrt{0.99 \times 0.99}$), one needs to ensure the dispersion-induced phase deviation is less than 0.01 radian within the desired wavelength range. For applications demanding less distortion on the filtered comb lines, this value could be even smaller.

In the traditional cavity designs, low-dispersion mirrors based on Bragg-stack mirrors (BSMs) 12 are commonly used, as shown in FIG. 1. Although BSMs 12 are typically high reflectors with a moderate bandwidth, different wavelengths reflect from different depths inside the structure. Consequently, only a narrow spectral range near the center of the high-reflectivity region experiences negligible group-delay dispersion, as shown by the narrow band about $\lambda_2$ in FIG. 2, imposing limitations on effective cavity bandwidth. In practice, slight optimization is usually required to broaden the usable bandwidth of such BSM-based, low-dispersion mirrors 12, but the possible improvement is very limited. In addition, any uncompensated group-delay dispersion from intracavity materials causes further bandwidth narrowing. As a result, the cavity is often in vacuum to avoid air dispersion. In this sense, any individual component with non-zero group-delay dispersion is limiting the cavity bandwidth.

Figure 3:
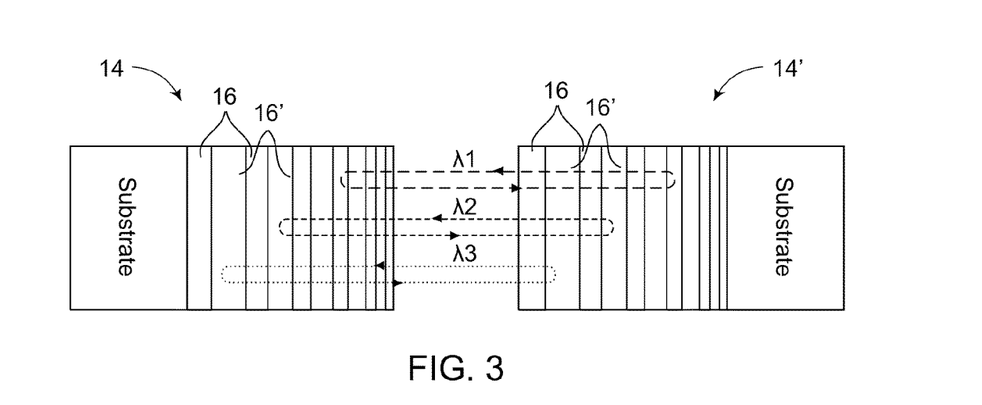
FIG. 3 is a schematic illustration of a two-mirror dispersion-free cavity based on a zero-group-delay-dispersion mirror pair.
Figure 4:
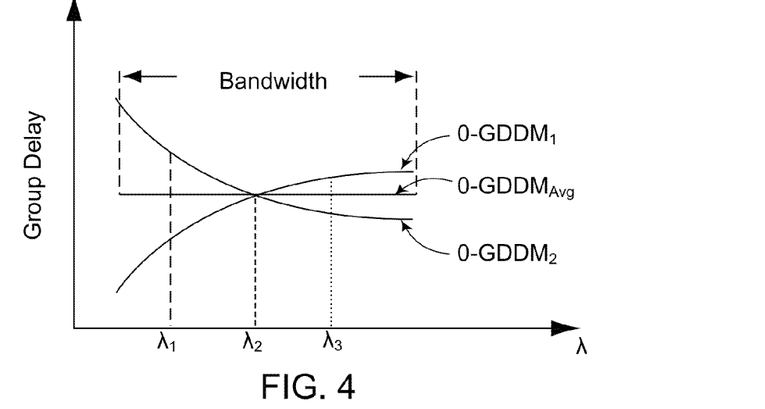
FIG. 4 plots curves showing the individual and average group delay on the cavity mirrors as a function of wavelength for the cavity of FIG. 3.

However, the real bottleneck, as discussed earlier, is the cavity round-trip time. A constant round-trip time for the wavelengths of interest does not imply that they have to travel at the same speed. Instead, as will be shown, below, allowing some group-delay dispersion on the mirror coating provides additional degrees of freedom to design cavity mirror sets for broadband cavities. This idea is illustrated in FIGS. 3 and 4 with a simple mirror pair 14, 14' shown as an example. Note that the concept can be easily generalized to a mirror set including more mirrors. As shown in the FIGS. 3 and 4, the thicknesses of the layers 16, 16', of the mirror pair 14, 14' are chirped to create a complementary, wavelength-dependent penetration depth in both mirror coatings with 7.5 mm (about 1 kPa) of air pressure in the cavity. With the total group-delay dispersion minimized, such a mirror pair 14, 14' constitutes a group-delay-dispersion-free building block for optical cavities.

To achieve the complementary wavelength-dependent penetration in a pair of complementary mirrors 14, 14' separated by a spacing through which the light can pass in optical path, as shown in FIG. 3, the thicknesses of the layers 16, 16' of the dielectric mirrors 14, 14' are varied to create a wavelength-dependent penetration depth in all cavity mirror coatings and to eliminate or substantially eliminate the cavity dispersion by requiring a constant cavity round-trip time across a broad range of wavelengths, as shown in FIG. 4, where the group-delay dispersion (0-GDDM$_1$) for a first mirror 14 complements the group-delay dispersion (0-GDDM$_2$) for a second mirror 14' to produce a sum zero-GDD (0-GDDM$_{AVG}$) within and beyond the band from $\lambda_1$ to $\lambda_3$.

Compared to BSM-based cavities that have no adjustability in mirror dispersion, the design described herein succeeds in reducing or eliminating differences in wavelength-dependent group-delay dispersion due to the fact that the chirped-mirrors 14, 14' intrinsically have larger bandwidth and offer high flexibility in customizing the mirror dispersion. Moreover, one can easily take the intracavity material dispersion into account during the design process and include multiple mirrors 14, 14' without degrading the bandwidth of the cavity, enabling new capabilities in related applications. Depending on the tolerances in residual phase, the bandwidth of such mirror pairs can be dramatically expanded.

Further still, the pressure of the gas (e.g., air) in the cavity between the mirrors can be adjusted, thereby shifting the group-delay dispersion of the light between the mirrors to provide an additional mechanism for fine-tuning the group-delay dispersion in the cavity (particularly if the group-delay dispersion is not precisely complementary—e.g., due to imperfections in the fabrication of the layers in each mirror.

For a complicated multi-mirror cavity, mirror sets 14, 14' can even be designed to provide additional features such as transmission windows at specific wavelengths to meet application requirements. Additionally, the cavity can use one or more zero-GDD mirror sets with all desired features without significant bandwidth reduction. In short, zero-GDD mirror sets can be in the form of a set of mirrors jointly optimized to provide custom reflectivity and negligible dispersion over a large bandwidth. Also, depending on the application, additional characteristics can be implemented during the design process.

The design of a zero-GDD mirror set can be based on the efficient group-delay (GD) computation approach developed in J. R. Birge and F. X. Kärtner, "Efficient optimization of multilayer coatings for ultrafast optics using analytic gradients of dispersion," Appl. Opt. 46, 2656-2662 (2007); and software code for use with this approach for mirror optimization is available at http://www.mit.edu/~birge/dispersion. Optimum layer thicknesses can be found by minimizing the merit function that evaluates the weighted deviation of the computed dispersion and reflectivity from the design goal. The wavelength range of interest is discretized into k points, denoted as $\lambda_k$. The employed merit function is simply determined by the summation of the weighted deviation from the targeted reflectivity and group-delay values corresponding to the thicknesses of the layer set, x:

$$f(x) = \sum_k \{\omega_R(\lambda_k)[R(\lambda_k; x) - R_{goal}(\lambda_k)]^4 + \omega_d(\lambda_k)[\tau_g(\lambda_k) - \tau_{g,goal}(\lambda_k) + \tau_{g0}(x)]^2\}, \quad (3)$$

where R is the reflectivity, $\tau_g$ is the group delay, and $\omega_{R/d}$ is the weighting function for the reflectivity and group-delay goals, respectively. The term $\tau_{g0}$ is used to exclude the irrelevant offset between the computed and ideal group delay, which minimizes f(x) for a given layer set x. To find good initial structures to start with, we first optimize all mirrors separately using smooth group-delay functions split from a group-delay goal that is complementary to the dispersion of the materials. This ensures that the remaining errors are mostly from higher-order dispersion. In the second step, the residual dispersion is minimized with an iterative optimization procedure in which all the mirrors are optimized in turns. The constant round-trip time is implemented in this step by updating the group-delay goal, $\tau_{g,goal}^k$, of the mirror to be optimized with the computed group delay of all other mirrors and the materials, as follows:

$$\tau_{g,goal}^k(\lambda_k) = -\sum_{i \neq k} \tau_g^{material}(\lambda_k) \quad (4)$$

The iteration continues until the target specification is reached.

Theoretically, an ultrabroadband (e.g., 650-1100 nm) zero-GDD mirror set can be produced using this algorithm by designing a complementary double-chirped mirror pair [F. Kärtner, et al., "Ultrabroadband double-chirped mirror pairs for generation of octave spectra," J. Opt. Soc. Am. B18(6), 882-885 (2001)], with one mirror having the opposite average group-delay dispersion as the other one. In practice, broadband highly dispersive mirror designs demand higher precision in fabrication, a requirement ultimately limited by the capability of current coating technology. The increased sensitivity stems simply from the increased penetration depth of the light into the mirror giving rise to spurious reflections. The deeper the penetration the more opportunity there is for such reflections to occur. As a result, the robustness of a practical design can be confirmed by adding random thickness perturbations to each layer, imitating manufacturing errors, and estimating the resulting phase errors for worst-case scenarios.

Mirror variables that can be manipulated to obtain complementary dispersion include the following: mirror-layer composition (to thereby manipulate the refractive index and reflectivity), the number of layers in each mirror, and the thickness of each layer. In each mirror, the mirror layers can include an alternating sequence of (a) a low-refractive-index material, such as $SiO_2$, and (b) a high-refractive-index material, such as $Nb_2O_5$, $TiO_2$, or $Ta_2O_5$.

The design of the layered structures of the mirrors can be carried out using a computer including a processor coupled with a non-transitory computer-readable storage medium in which is stored an optical-coating design tool, such as OPTI-LAYER thin-film software (available from OptiLayer, Ltd., Moscow Russia). One can start with an initial base configuration of layers (e.g., where each layer has a quarter-wave thickness for the central wavelength) and then, in an iterative process, determine via a global algorithm where the greatest impact toward providing complementary dispersion across a broad range of wavelengths in the mirrors can be made by (a) increasing or decreasing the thickness of one or more of the layers in the mirrors, (b) adding or removing one or more layers from the mirrors, or (c) changing the type of material assigned to one or more layers until mirrors are generated (such as those having the designs shown in FIG. 6) that have complementary dispersion profiles for consistent round-trip periods across a broad swath of wavelengths in the cavity.

To change the range of wavelengths over which the mirrors are complementary, the mirror designs can be scaled upward or downward to respectively target longer or shorter wavelengths. For example, one can increase layer thicknesses approximately by a fixed proportion to scale to longer wavelengths, though the increase in layer thickness can be further adjusted to account for changes in the indices of refraction at longer wavelengths.

Once the mirror designs are finalized, the designs can then be submitted to a mirror manufacturer with an order for mirror fabrication according. The mirror manufacturer will then fabricate mirrors with deposited layers according to the designs.

Experimental Demonstration: Two-mirror Zero-GDD Mirror Pair for Green (480-580 nm) Filtering Cavities To demonstrate the concept of zero-GDD, a mirror set was designed with a complementary mirror pair supporting a dispersion-free region from 480 to 580 nm. This zero-GDD pair was aimed for a moderate-finesse (>250) Fabry-Perot filtering cavity, as used in a green astro-comb. Astro-combs that cover spectral bands in the green range (480 nm-580 nm) are of particular interest in high accuracy astronomical spectroscopy because this wavelength region provides the largest photon flux from sun-like stars and is rich in spectral features of high quality. Charge-coupled devices (CCDs) used in astrophysical spectrographs also have better response in this wavelength region. Recently, we demonstrated a blue astro-comb (410 nm-425 nm) [A. J. Benedick, et al., "Visible wavelength astro-comb," Opt. Express 18(18), 19175-19184 (2010)] based on a frequency-doubled 1 GHz Ti:sapphire frequency comb filtered by a Fabry-Perot cavity. Limited by the bandwidth of the phase matching of the frequency doubling process in a 1-mm-thick beta-barium borate (BBO) crystal, the blue astro-comb has a bandwidth of only 15 nm, which is slightly narrower than the transmission bandwidth of the Fabry-Perot cavity (20 nm) made with two identical, individually-optimized low-dispersion mirrors. In order to design more powerful astro-combs that span much larger bandwidths using our recently developed broadband visible source [G. Chang, L.-J. Chen, and F. X. Kärtner, "Highly efficient Cherenkov radiation in photonic crystal fibers for broadband visible wavelength generation," Opt. Lett. 35(14), 2361-2363 (2010)], a broadband dispersion-free cavity using a zero-GDD mirror pair was constructed.

Figure 5:
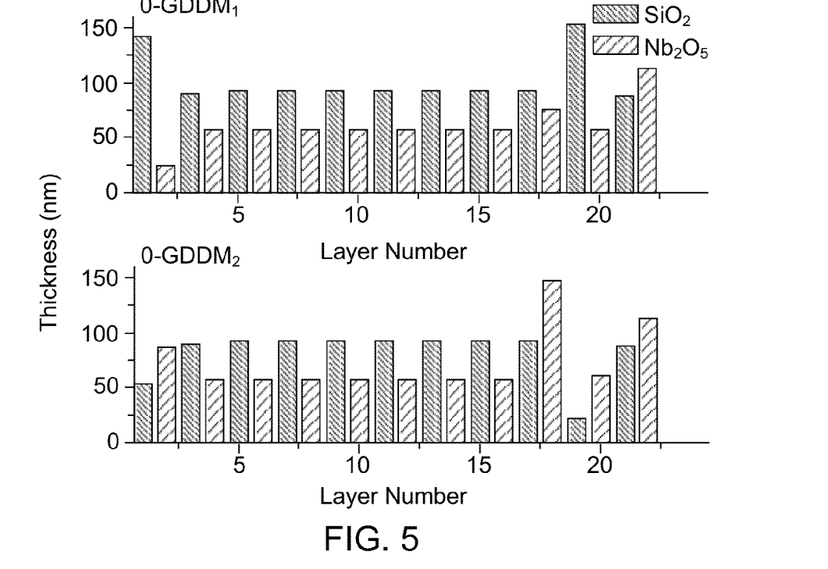
FIG. 5 plots the layer thicknesses for the structure of a two-mirror zero-GDD mirror set designed for a 40 GHz free-spectral range, 100 nm bandwidth (480-580 nm) cavity using $Nb_2O_5/SiO_2$ layer pairs.
Figure 6:
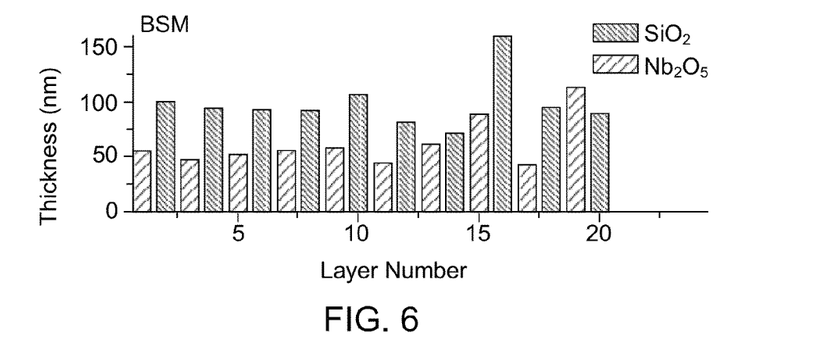
FIG. 6 plots the layer thicknesses for the structure of a low-dispersion Bragg-stack mirror that is individually optimized for the same goal as the mirrors of FIG. 5.

FIG. 5 shows the structure of a two-mirror zero-GDD mirror set designed for a 40 GHz FSR, 100 nm bandwidth (480-580 nm) cavity using $Nb_2O_5/SiO_2$ layer pairs, where odd-numbered layers are formed of $SiO_2$, and even-numbered layers are formed of $Nb_2O_5$, and where a majority of the layers have quarter-wavelength thickness for the central wavelength. The mirrors each have corresponding layers numbered 1-22, where layer number 1 is the inner-most layer, which is nearest the other mirror in the configuration of the cavity and facing the spacing between the mirrors (and the last layer deposited on the mirror substrate); and layer number 22 is the outer-most layer furthest from the other mirror (and the first layer deposited on the substrate). Both mirrors (0-GDDM1, top, and 0-GDDM2, bottom) have a very similar structure except for layer pairs (1, 2) and (18, 19), which are slight deviations from the quarter-wave layers in between. These layer pairs shift the penetration depth of different wavelengths in the two mirrors in different directions (see FIG. 3). Since the selected application demands extremely low phase error, the sensitivity of the mirrors to fabrication errors was tested by adding a random thickness variation of ±0.5 nm to each layer. For comparison, FIG. 6 shows the structure of a similar low-dispersion BSM mirror centered at 530 nm that is individually optimized for the same goal.

Figure 7:
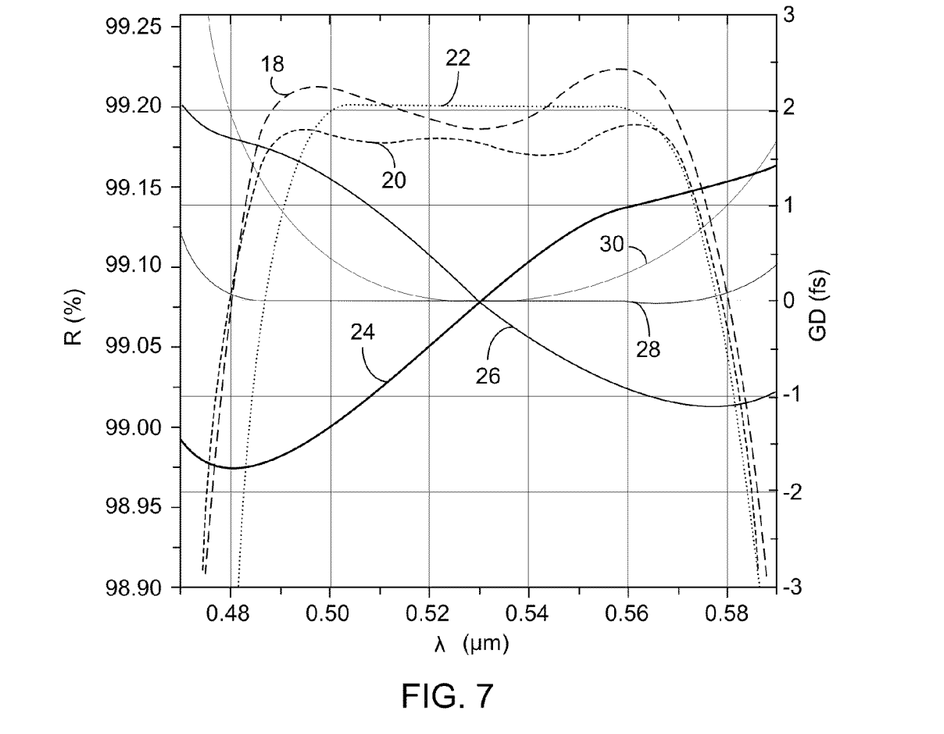
FIG. 7 plots the calculated reflectivity and group delay of the zero-GDD mirror pair, and the total cavity group delay using the zero-GDD mirror pair is calculated by taking the dispersion of both mirrors and 7.5 mm of air into account; as a comparison, the total group delay and reflectivity of a cavity in vacuum based on two of the individually optimized, low-dispersion BSMs is also shown.

The calculated reflectivity and group delay of the zero-GDD mirror pair designed for a ~40 GHz FSR cavity is shown in FIG. 7. The dispersion caused by 7.5 mm of intracavity air (~0.24 $fs^2$ for 1 atmosphere at 300 K) is taken into account during the optimization. With an initial structure of 22 layers of $Nb_2O_5/SiO_2$ quarter-wave layer pairs, both mirrors are optimized to have a reflectivity of ~99.2% and complementary dispersion over the desired range (FIG. 7), which supports a FP filtering cavity with a finesse of ~390.

FIG. 7 shows the calculated reflectivity, R, for 0-GDDM1 (FIG. 5, top) with plot 18, for 0-GDDM2 (FIG. 5, bottom) with plot 20, and for the vacuum-based BSM (FIG. 6) with plot 22. FIG. 7 also shows the group delay of 0-GDDM1 with curve 24 and of 0-GDDM2 with curve 26. The total cavity group delay using the zero-GDD mirror pair of FIG. 5 is shown with plot 28 and is calculated by taking the dispersion of both mirrors and 7.5 mm of air into account. As a comparison, the total group delay of the cavity in vacuum based on two individually-optimized, low-dispersion BSMs of FIG. 6 is shown with plot 30. Comparing the calculated total group-delay of the Fabry-Perot cavities built with both designs, we find a three-fold bandwidth improvement with the new zero-GDD mirror set design even when the traditional BSM design is evaluated for a cavity in vacuum. Such improvement is due to the simultaneous optimization of the mirrors of the zero-GDD set.

As mentioned above, the bandwidth can be even larger if the mirror structures are more chirped. However, this additional chirping will inevitably degrade the manufacturability of the mirrors and causes uncertainty for astro-comb applications that demand extremely low phase error. As a result, quarter-wave layer pairs were used, which were identical to the traditional design, as the initial structure for optimizing the zero-GDD mirror set, a conservative design that improves robustness to manufacturing errors.

FIG. 8 illustrates the simulated phase deviation from a zero-dispersion cavity using the zero-GDD mirror pair shown in FIG. 5 with manufacturing thickness errors taken into account. The analysis is performed with 100 tests assuming random layer thickness fluctuations of ±0.5 nm on each layer of both mirrors. The spread of possible round-trip phase errors confirms that the criterion (2) is fulfilled in the presence of reasonable manufacturing tolerances. The deviation of the ideal zero-GDD mirror pair design is near horizontal band 32 in the center deviating only slightly from zero phase error, and the spread of possible phase errors with 100 tests assuming a random manufacturing error of ±0.5 nm for the mirror layer thicknesses is shown with the broader band 34 of plots, which show phases errors roughly in the range from +0.007 to −0.007 rad across wavelengths from 0.49 μm to 0.57 μm; and the 100 tests show a maximum phase error of <0.015 rad across the full bandwidth.

Figure 9:
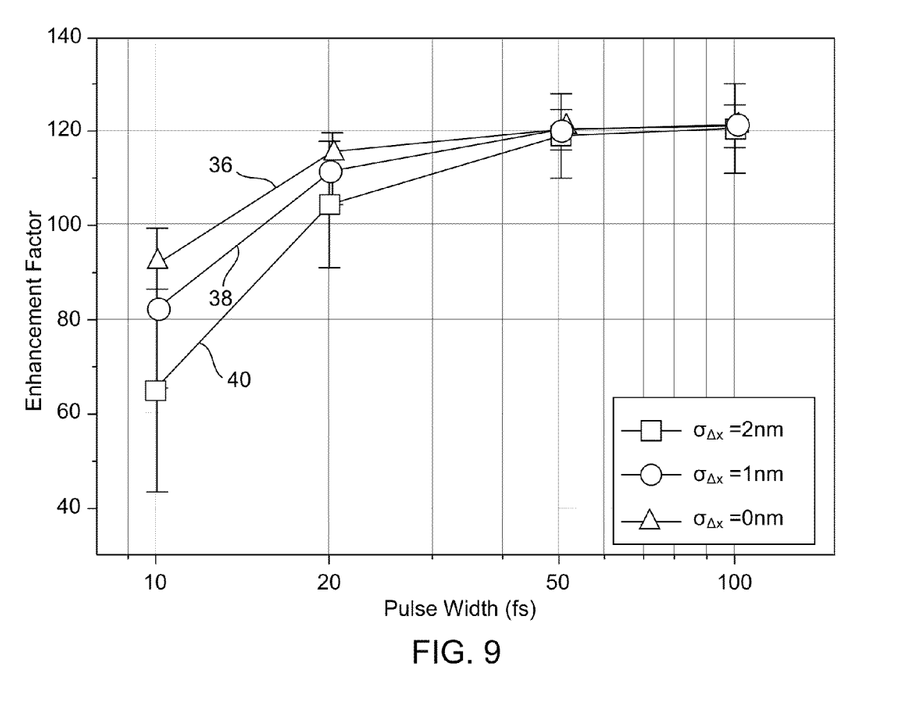
FIG. 9 plots estimated enhancement factors for 100, 50, 20 and 10 fs Gaussian pulses considering normally distributed manufacturing errors with a standard deviation, $\sigma_x$, of 0 nm (top), 1 nm (middle), and 2 nm (bottom); each marker shows the average value, and the error bar shows the standard deviation of the enhancement factor for 1,000 tests.

Another analysis on the zero-GDD mirror pair was also performed to show that the zero-GDD mirror pair can also be applied to broadband pulse enhancement in the few-cycle pulse regime. The enhancement factor for 100, 50, 20 and 10 fs Gaussian pulses was simulated with the central wavelength matched to the cavity. Normally distributed random thickness errors with a standard deviation $\sigma_x$ of 0, 1, and 2 nm were added to each layer. The enhancement factor was obtained by calculating the peak intensity of the steady-state intracavity pulse normalized to the input pulse. With 1000 tests on each combination of pulse duration and manufacturing tolerances, the average enhancement factor and its standard deviation were obtained, wherein FIG. 9 shows each of the 0-nm plot 36, the 1-nm plot 38, and the 2-nm plot 40.

The result clearly indicates that the enhancement factor approaches the theoretical limit even for relatively low accuracy in fabrication ($\sigma_x$=2 nm); an average enhancement factor of ~100 can be achieved for transform-limited pulses as short as 20 fs. For applications requiring ultra-high peak intensity from cavity-enhanced femtosecond lasers, laser-induced damage threshold (LIDT) can be a critical issue. However, in the sub-picosecond regime, LIDT does not scale linearly with the pulse duration, $\tau$, but proportional to $\tau^x$, where x<0.5. For extremely high intensity experiments, however, special cavity designs [as described in F. Gori, et al., "Bessel-Gauss Beams," Opt. Commun. 64(6), 491-495 (1987); and in W. P. Putnam, et al., "High-Intensity Bessel-Gauss Beam Enhancement Cavities," in *Conference on Lasers and Electro-Optics*, OSA Technical Digest (CD) (Optical Society of America, 2010), paper CMD1] and high-damage-threshold coating materials can be used.

For experimental demonstration, a tunable visible light source using Cherenkov radiation from a photonic crystal fiber (PCF) was constructed. When pumped by ultrashort pulses (~10 fs), this mechanism becomes a low-threshold nonlinear process for broadband, highly efficient optical frequency up-conversion [G. Chang, L.-J. Chen, and F. X. Kärtner, "Highly efficient Cherenkov radiation in photonic crystal fibers for broadband visible wavelength generation," Opt. Lett. 35(14), 2361-2363 (2010); and L. Chen, G. Chang, and F. X. Kärtner, "Highly Efficient, Broadband Cherenkov Radiation in Photonic Crystal Fibers," in *Conference on Lasers and Electro-Optics*, OSA Technical Digest (CD) (Optical Society of America, 2010), paper CTuT3]. This light source can generate a 40-GHz green astro-comb for astronomical spectograph calibration.

Figure 10:
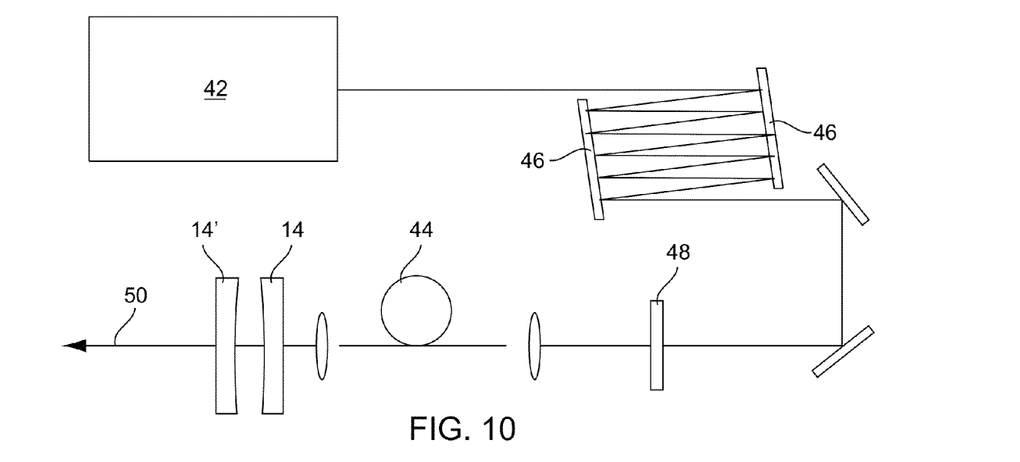
FIG. 10 is a schematic illustration of an experimental setup for generating a 40-GHz green astro-comb for astronomical spectrograph calibration.

The experimental setup for this demonstration is shown in FIG. 10. An octave-spanning Ti:sapphire laser 42 operating at 1 GHz repetition rate pumped a photonic crystal fiber (PCF) 44 with a zero-dispersion wavelength at 710 nm (NL-1.8-710). An achromatic half-wave plate 48 and several bounces from broadband dispersion-compensating mirrors 46 were employed to optimize the polarization and duration of the input pulses, as shown in FIG. 10. With ~200 pJ of coupled pulse energy, the PCF 44 emitted in the visible wavelength range covered (for zero-GDD) by the designed mirror bandwidth. A filtered output 50 is emitted from the 40-GHz filter cavity (formed of mirrors 14, 14').

Figure 11:
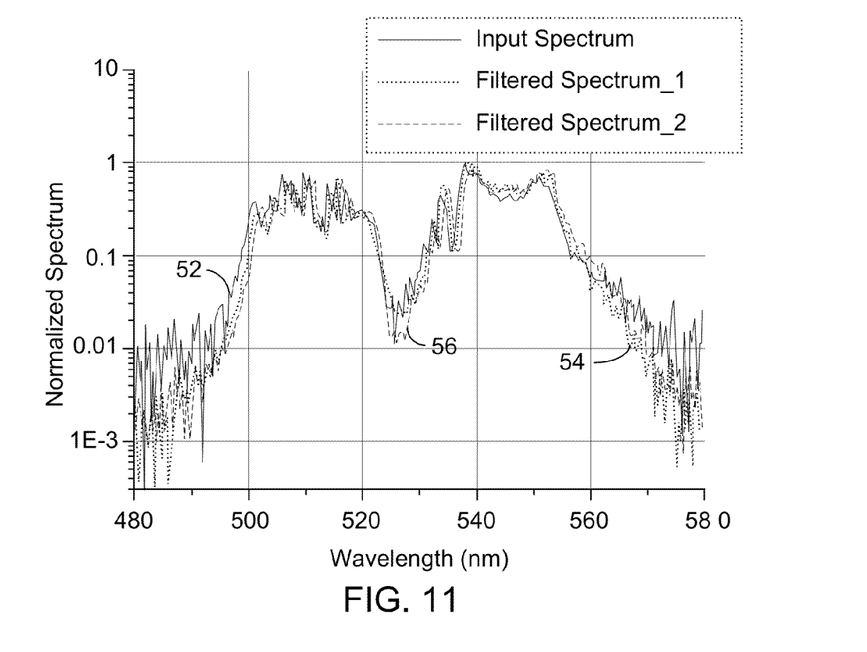
FIG. 11 plots the Input (top) and output (bottom) spectra before and after the 40-GHz Fabry-Perot filter cavity based on a zero-GDD mirror pair.
Figure 12:
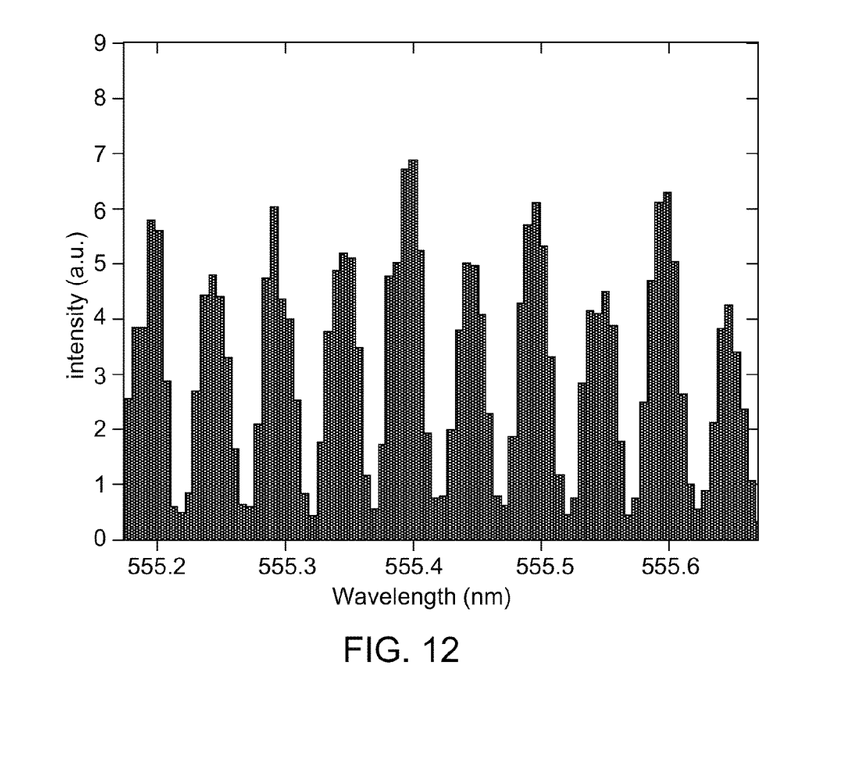
FIG. 12 shows the detailed output spectrum near 555.4 nm obtained with a high resolution (~20 GHz) optical spectrum analyzer; fluctuations of the cavity relative to the comb laser are below 5 MHz leading to an overall phase error of <1 mrad per square root of the number of output astro-comb lines.

FIG. 11 shows spectra before and after a ~40 GHz dispersion-free filtering cavity, measured with a low-resolution spectrometer. The filtering Fabry-Perot cavity included the zero-GDD mirror coatings on slightly wedged flat substrates for avoiding etaloning effects. As revealed by the plots of FIG. 11—which shows the input spectrum 52 and a pair of filtered output spectra 54, 56—the measured laser spectra were nearly undistorted after passing through the cavity, demonstrating successful filtering over the entire bandwidth of the zero-GDD mirror pair 14, 14'. The detailed spectrum, shown in FIG. 12, was acquired with an optical spectrum analyzer (OSA) and further confirms that the individual comb lines become resolvable after filtering. The measured linewidth of the resolved comb lines was limited by the OSA, which has a resolution of ~20 GHz.

Exemplary Applications

The zero-GDD mirror set and methods described herein enable laser frequency combs for pulse repetition-rate multiplication and pulse enhancement. By structure scaling and re-optimization, the spectral coverage of the zero-GDD mirror set can be easily shifted to other wavelengths. Further performance improvement can also be achieved by using better manufacturing techniques or materials with higher refractive index contrast since the intrinsic bandwidth of dielectric mirrors is proportional to $(n_{HL}-1)/(n_{HL}+1)$, where $n_{HL}$ is the ratio of higher refractive index to lower index of the dielectric materials. We believe this technique can also enable many other frequency-comb-based applications that demand large comb spacing or high peak intensity. The dispersion-free cavity can be used in a variety of applications including, for example, the high-intensity enhancement cavities described in U.S. patent application Ser. No. 12/894,620 and the efficient high-harmonic-generation-based extreme ultraviolet source driven by short wavelength light described in U.S. patent application Ser. No. 12/966,574.

In describing embodiments of the invention, specific terminology is used for the sake of clarity. For the purpose of description, specific terms are intended to at least include technical and functional equivalents that operate in a similar manner to accomplish a similar result. Additionally, in some instances where a particular embodiment of the invention includes a plurality of system elements or method steps, those elements or steps may be replaced with a single element or step; likewise, a single element or step may be replaced with a plurality of elements or steps that serve the same purpose. Further, where parameters for various properties are specified herein for embodiments of the invention, those parameters can be adjusted up or down by $1/100^{th}$, $1/50^{th}$, $1/20^{th}$, $1/10^{th}$, $1/5^{th}$, $1/3^{rd}$, $1/2$, $3/4^{th}$, etc. (or up by a factor of 2, 5, 10, etc.), or by rounded-off approximations thereof, unless otherwise specified. Moreover, while this invention has been shown and described with references to particular embodiments thereof, those skilled in the art will understand that various substitutions and alterations in form and details may be made therein without departing from the scope of the invention. Further still, other aspects, functions and advantages are also within the scope of the invention; and all embodiments of the invention need not necessarily achieve all of the advantages or possess all of the characteristics described above. Additionally, steps, elements and features discussed herein in connection with one embodiment can likewise be used in conjunction with other embodiments. The contents of references, including reference texts, journal articles, patents, patent applications, etc., cited throughout the text are hereby incorporated by reference in their entirety; and appropriate components, steps, and characterizations from these references optionally may or may not be included in embodiments of this invention. Still further, the components and steps identified in the Background section are integral to this disclosure and can be used in conjunction with or substituted for components and steps described elsewhere in the disclosure within the scope of the invention. In method claims, where stages are recited in a particular order—with or without sequenced prefacing characters added for ease of reference—the stages are not to be interpreted as being temporally limited to the order in which they are recited unless otherwise specified or implied by the terms and phrasing.

What is claimed is:

1. A substantially dispersion-free optical filter cavity, comprising:
    a first multilayer mirror including layers of a less-refractive material and layers of a more-refractive material, the more-refractive material having a higher index of refraction than the less-refractive material, and the layers being successively arranged from an inner layer to an outer layer;
    a second multilayer mirror including layers of the less-refractive material and layers of the more-refractive material, and the layers being successively arranged from an inner layer to an outer layer to correspond with the arrangement of layers in the first multilayer mirror; and
    spacing between the first and second multilayer mirrors, wherein the first and second multilayer mirrors are configured to define an optical path for light to pass through the spacing when reflected between the mirrors, wherein the thickness of a plurality of the layers in the second multilayer mirror differ from corresponding layers in the first multilayer mirror to provide the cavity with complementary group-delay across the cavity with a phase difference within ±0.015 rad across a range of wavelengths spanning at least 50 nm, and wherein the spacing comprises a gas atmosphere at a pressure of at least about 1 kPa, and wherein the group-delay dispersion provided by the first and second multilayer mirrors balance the group-delay dispersion provided by the gas to maintain the complementary group-delay dispersion across the cavity.

2. The cavity of claim 1, wherein the cavity has the complementary group-delay dispersion across a range of wavelengths spanning at least 100 nm.

3. The cavity of claim 2, wherein the range of wavelengths spans 480 to 580 nm.

4. The cavity of claim 1, wherein the less-refractive material is $SiO_2$.

5. The cavity of claim 1, wherein the more-refractive material is selected from at least one of $Nb_2O_5$, $TiO_2$ and $Ta_2O_5$.

6. The cavity of claim 1, wherein the optical path for the light is defined by only two mirrors.

7. The cavity of claim 1, wherein the optical path for the light is defined by at least three multilayer mirrors, wherein the sum of the group-delay dispersion provided by each mirror and the spacing is complementary across the range of wavelengths.

8. The cavity of claim 1, wherein a majority of the layers in each multilayer mirror has a thickness that when multiplied by the layer's index of refraction is about one quarter of a central wavelength of the range of wavelengths.

9. The cavity of claim 1, wherein one of the first and second multilayer mirrors provides positive dispersion, and the other multilayer mirror provides negative dispersion.

10. The cavity of claim 1, wherein both of the multilayer mirrors provides negative dispersion, and wherein gas in the spacing provides positive dispersion.

11. A method for providing complementary group-delay dispersion in an optical cavity filter comprising:
providing at least a first and second multilayer mirror separated by spacing, each mirror including layers of a less-refractive material and layers of a more-refractive material, the more-refractive material having a higher index of refraction than the less-refractive material, and the layers being successively arranged from an inner layer to an outer layer, wherein the thickness of a plurality of the layers in the second multilayer mirror differ from corresponding layers in the first multilayer mirror to provide the cavity with complementary group-delay dispersion across the cavity with a phase difference within ±0.015 rad across a range of wavelengths spanning at least 50 nm, and wherein the spacing between the multilayer mirrors is filled with a gas atmosphere at a pressure of at least about 1 kPa;
directing light into the cavity and reflecting the light between the first and second multilayer mirrors with the complementary group-delay dispersion across the range of wavelengths; and
adjusting the gas pressure in the spacing to further reduce the group-delay dispersion across the range of wavelengths.

12. The method of claim 11, wherein the light passes between the mirrors with a round-trip time that matches a resonance frequency of the optical cavity filter.

13. The method of claim 11, wherein the range of wavelengths includes a first wavelength and a second wavelength, wherein light at the first wavelength penetrates deeper into the first multilayer mirror than does light at the second wavelength, and wherein the light at the second wavelength penetrates deeper into the second multilayer mirror than does the light at the first wavelength.

14. The method of claim 11, further comprising using light from the optical filter cavity in a green astro-comb for astronomical spectrograph calibration.

* * * * *